United States Patent
Moors et al.

(10) Patent No.: US 9,882,071 B2
(45) Date of Patent: Jan. 30, 2018

(54) LASER TECHNIQUES FOR FOIL-BASED METALLIZATION OF SOLAR CELLS

(71) Applicant: SUNPOWER CORPORATION, San Jose, CA (US)

(72) Inventors: Matthieu Moors, Braine-le-Chateau (BE); Markus Nicht, Hohenbrunn (DE); Daniel Maria Weber, Augsburg (DE); Rico Bohme, Rochlitz (DE); Mario Gjukic, Munich (DE); Gabriel Harley, Mountain View, CA (US); Mark Kleshock, Phoenix, AZ (US); Mohamed A. Elbandrawy, Danville, CA (US); Taeseok Kim, San Jose, CA (US)

(73) Assignees: SunPower Corporation, San Jose, CA (US); Total Marketing Services, Puteaux (FR)

( * ) Notice: Subject to any disclaimer, the term of this patent is extended or adjusted under 35 U.S.C. 154(b) by 0 days.

(21) Appl. No.: 15/201,349

(22) Filed: Jul. 1, 2016

(65) Prior Publication Data

US 2018/0006171 A1    Jan. 4, 2018

(51) Int. Cl.
*H01L 31/0224*    (2006.01)
*H01L 31/05*    (2014.01)
(Continued)

(52) U.S. Cl.
CPC .... *H01L 31/022441* (2013.01); *H01L 31/028* (2013.01); *H01L 31/02168* (2013.01); *H01L 31/02363* (2013.01); *H01L 31/03682* (2013.01); *H01L 31/0745* (2013.01); *H01L 31/18* (2013.01); *H01L 31/1864* (2013.01); *H01L 31/022433* (2013.01); *H01L 31/0512* (2013.01); *H01L 31/0516* (2013.01)

(58) Field of Classification Search
CPC .......................................... H01L 31/00–31/208
See application file for complete search history.

(56) References Cited

U.S. PATENT DOCUMENTS 4,296,270 A    10/1981    Köhler
4,367,581 A    1/1983    Köhler
(Continued)

*Primary Examiner* — Victor A Mandala
*Assistant Examiner* — Regan J Rundio
(74) *Attorney, Agent, or Firm* — Schwabe, Williamson & Wyatt, P.C.

(57) ABSTRACT

Methods of fabricating a solar cell including metallization techniques and resulting solar cells, are described. In an example, a semiconductor region can be formed in or above a substrate. A first metal layer can be formed over the semiconductor region. A laser can be applied over a first region of the metal layer to form a first metal weld between the metal layer and the semiconductor region, where applying a laser over the first region comprises applying the laser at a first scanning speed. Subsequent to applying the laser over the first region, the laser can be applied over a second region of the metal layer where applying the laser over the second region includes applying a laser at a second scanning speed. Subsequent to applying the laser over the second region, the laser can be applied over a third region of the metal layer to form a second metal weld, where applying the laser over the third region comprises applying the laser at a third scanning speed.

8 Claims, 5 Drawing Sheets

(51) Int. Cl.
*H01L 31/028* (2006.01)
*H01L 31/18* (2006.01)
*H01L 31/0368* (2006.01)
*H01L 31/0745* (2012.01)
*H01L 31/0236* (2006.01)
*H01L 31/0216* (2014.01)

(56) References Cited

U.S. PATENT DOCUMENTS

| | | |
|---|---|---|
| 8,609,976 B2 | 12/2013 | Tai et al. |
| 8,778,720 B2 | 7/2014 | Kim et al. |
| 8,975,510 B2 | 3/2015 | Coakley |
| 2012/0132251 A1 | 5/2012 | Sedlacek et al. |
| 2016/0126390 A1* | 5/2016 | Zhao ............... H01L 31/02008 136/251 |

\* cited by examiner

LASER TECHNIQUES FOR FOIL-BASED METALLIZATION OF SOLAR CELLS

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

Techniques for increasing the efficiency of solar cells, or techniques for increasing the efficiency in the manufacture of solar cells, are generally desirable. Some embodiments of the present disclosure allow for increased solar cell manufacturing efficiency by providing novel processes for fabricating solar cell structures.

DETAILED DESCRIPTION

Figure 1:
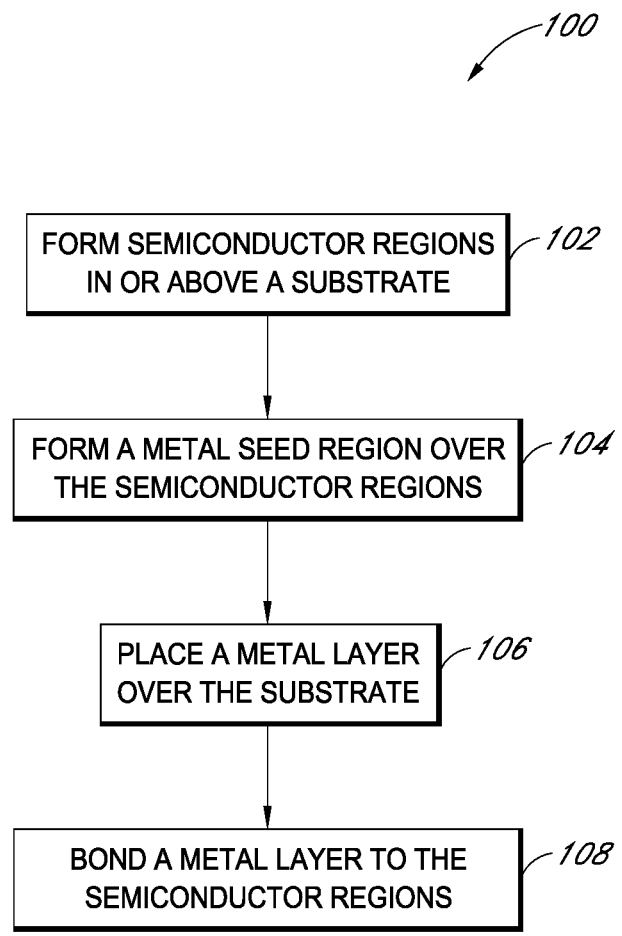
FIG. 1 illustrates a flowchart listing operations in a method of fabricating a solar cell corresponding to FIGS. 3A-3C, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" metal weld does not necessarily imply that this metal weld is the first metal weld in a sequence, instead the term "first" is used to differentiate this metal weld from another metal weld (e.g., a "second" metal weld).

"Based. On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper" "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

Approaches for foil-based metallization of solar cells and the resulting solar cells are described herein. In the following description, numerous specific details are set forth, such as specific process flow operations, in order to provide a thorough understanding of embodiments of the present disclosure, it will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating a solar cell involves forming a plurality of alternating N-type and P-type semiconductor regions in or above a substrate. The method also involves bonding and/or adhering a metal foil to the alternating N-type and P-type semiconductor regions using laser techniques. In an embodiment, the scanning speed of a laser can be varied (e.g., not constant) to increase the overall scan time and form good electrical contact (e.g., metal welds) between the metal foil and the alternating N-type and P-type semiconductor regions.

Figure 3A:
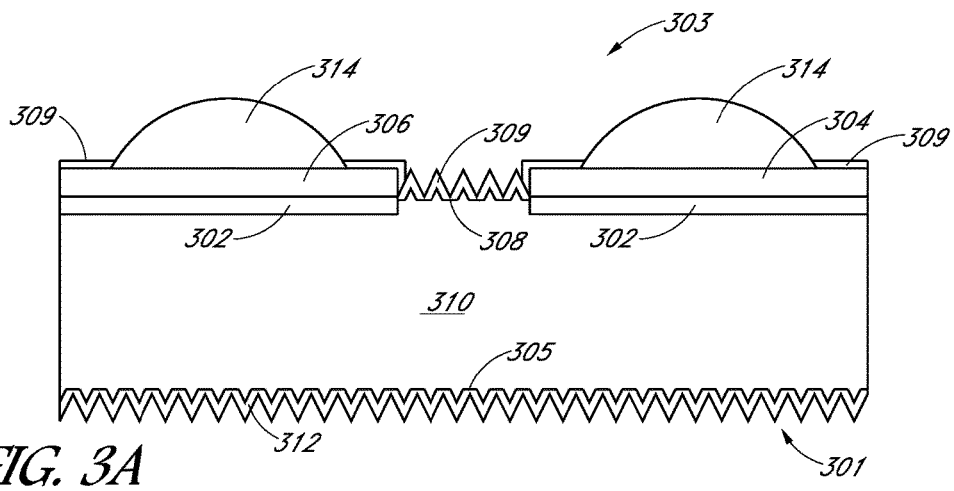
FIGS. 3A, 3B and 3C illustrate cross-sectional views of various stages in the fabrication of a solar cell, according to some embodiments.
Figure 3B:
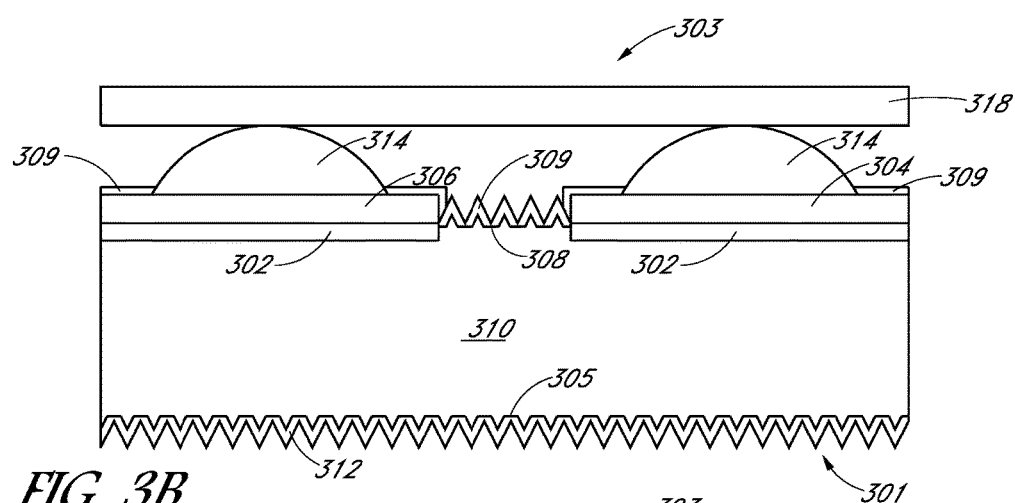
Figure 3C:
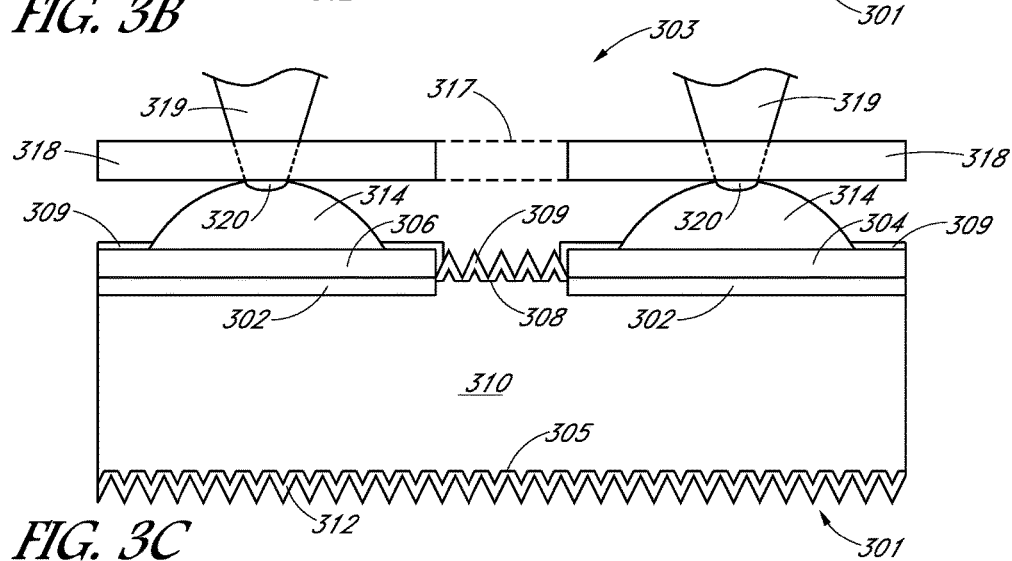

FIG. 1 is a flowchart listing operations in a method of fabricating a solar cell corresponding to FIGS. 3A-3C, according to some embodiments. In various embodiments, the method of FIG. 1 can include additional (or fewer) blocks than illustrated. For example, in some embodiments, a metal seed region need to be formed at block 104, where, in an embodiment, a metal layer (e.g., metal foil) can be placed and bonded directly to a first and second semiconductor region.

Figure 2:
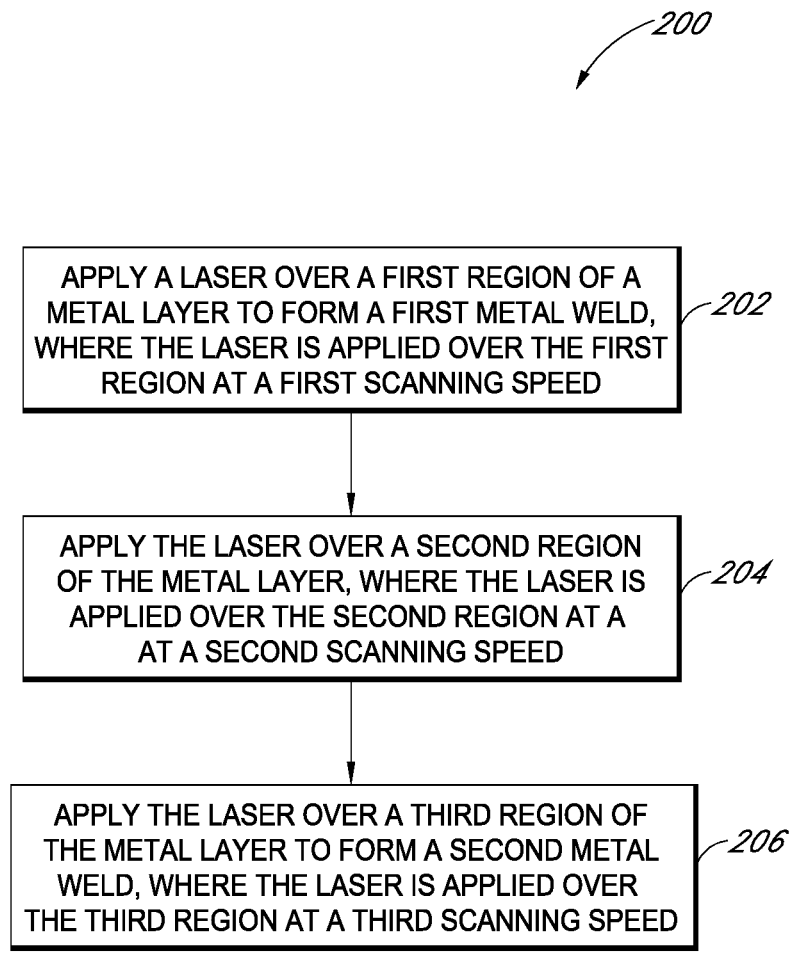
FIG. 2 illustrates a flowchart listing operations in a method of for metallization of a solar cell corresponding to FIGS. 4 and 5, according to some embodiments.
Figure 4:
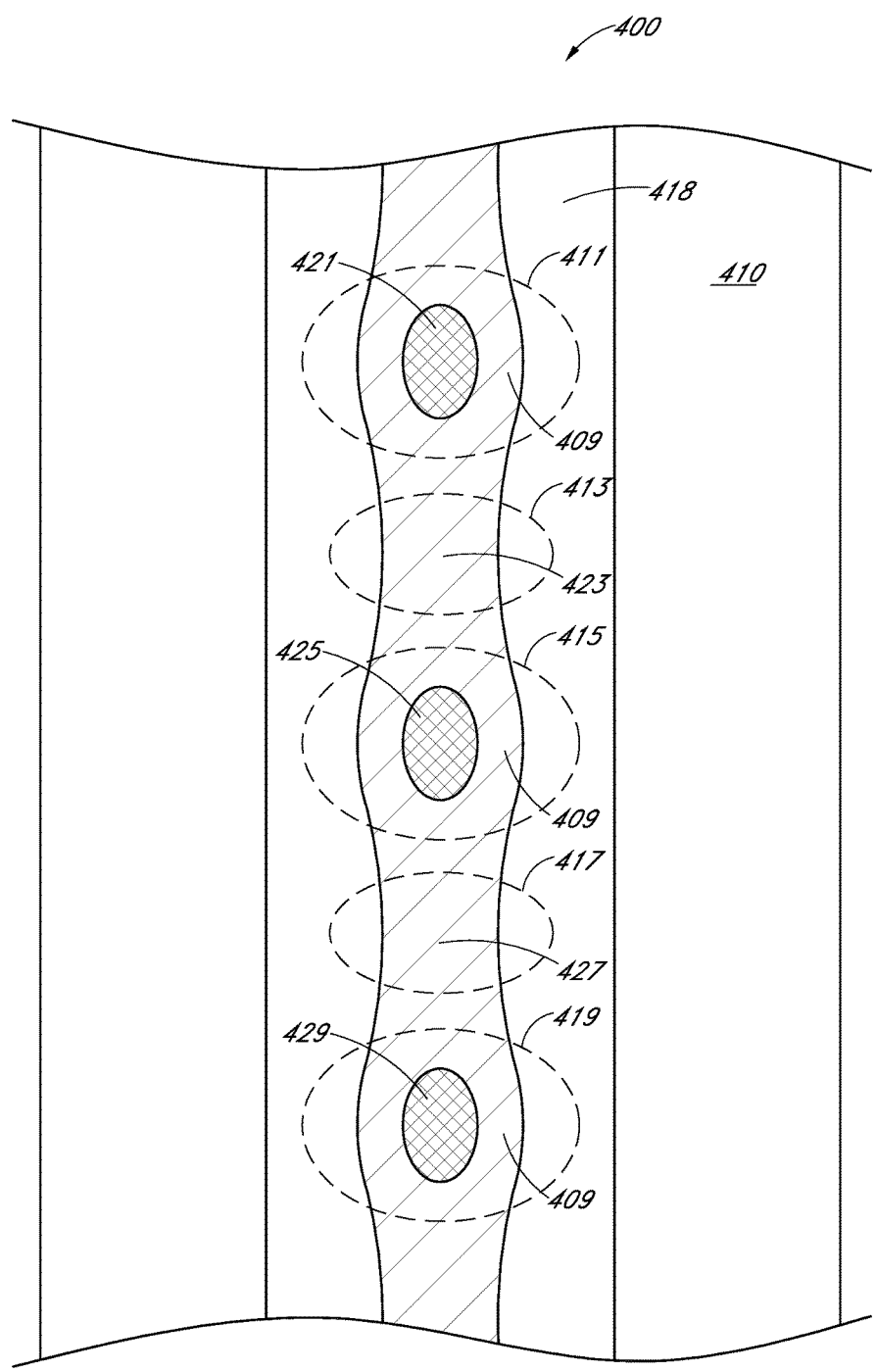
FIG. 4 illustrates a top view of a portion of a solar cell, according to some embodiments.
Figure 5:
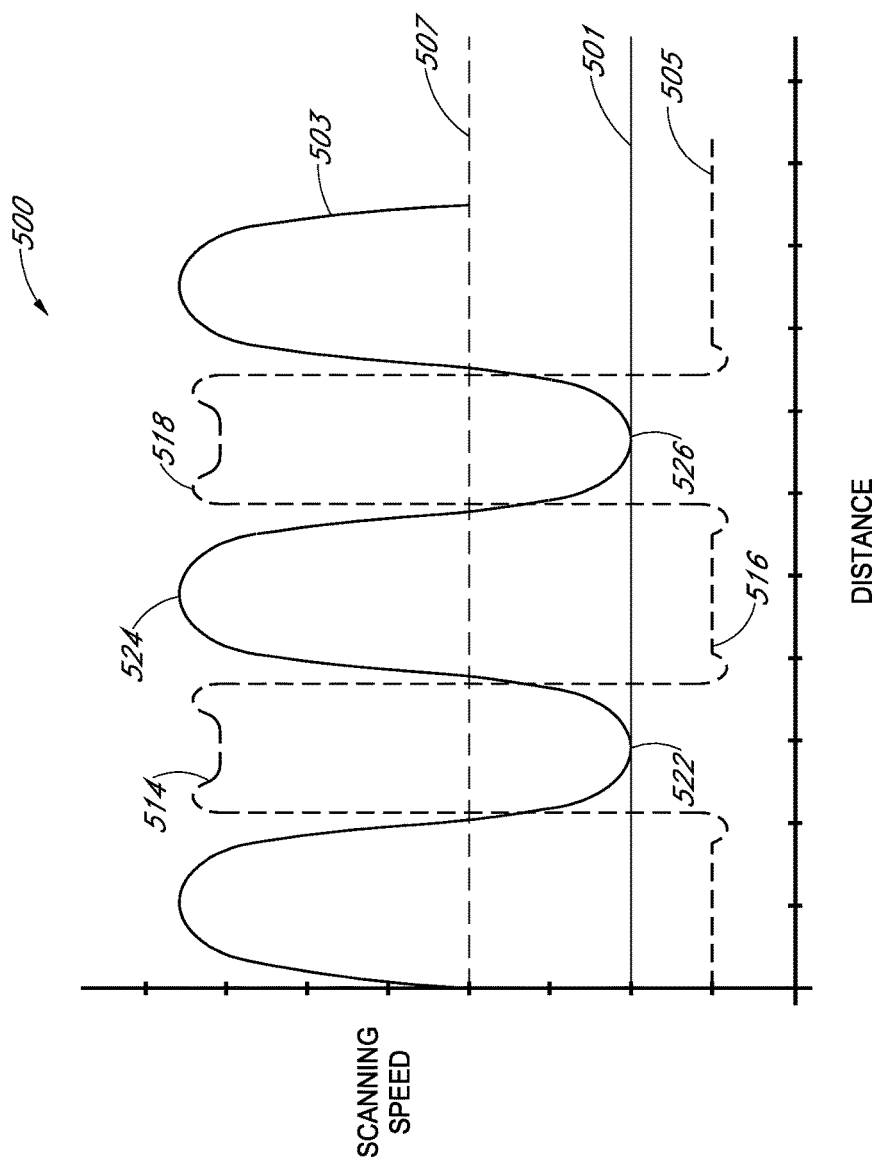
FIG. 5 illustrates an example graph, according to some embodiments.

FIG. 2 is a flowchart listing operations in a method of metallization for a solar cell as corresponding to FIGS. 4 and 5, according to some embodiments.

Referring to FIG. 3A and corresponding operation 102 from the flowchart 100 of FIG. 1, a semiconductor region can be formed in or above a substrate. In an embodiment a first and second semiconductor region 304, 306 can be formed on a back surface 303 of a substrate 310. In an example, a first and second semiconductor region 304, 306 can be a plurality of alternating N-type and P-type semiconductor regions formed in or above the substrate 310. In particular, in an embodiment, a substrate 310 has disposed there above first and second semiconductor regions 304, 306 disposed on a thin dielectric layer 302. In an embodiment, the thin dielectric layer 302 can be an intervening material between the first and second semiconductor regions 304, 306, respectively, and the substrate 310. The substrate 310 can have a front surface 301 opposite the back surface 303 of the substrate 310, where the back surface 303 is opposite a front surface 301.

In an embodiment, the substrate 310 is a monocrystalline silicon substrate, such as a bulk single crystalline N-type doped silicon substrate. It is to be appreciated, however, that substrate 310 may be a layer, such as a multi-crystalline silicon layer, disposed on a global solar cell substrate. In an embodiment, the thin dielectric layer 302 is a tunneling silicon oxide layer having a thickness of approximately 2 nanometers or less. In one such embodiment, the term "tunneling dielectric layer" refers to a very thin dielectric layer, through which electrical conduction can be achieved. The conduction may be due to quantum tunneling and/or the presence of small regions of direct physical connection through thin spots in the dielectric layer. In one embodiment, the tunneling dielectric layer includes a thin silicon oxide layer.

In an embodiment, the alternating first and second semiconductor regions 304 and 306, respectively, are formed polycrystalline silicon regions formed by, e.g., using a plasma-enhanced chemical vapor deposition (PECVD) process. In one embodiment, the first and second semiconductor regions are N-type and P-type polycrystalline silicon regions. In one such embodiment, the N-type polycrystalline silicon emitter regions 304 are doped with a N-type impurity, such as phosphorus. The P-type polycrystalline silicon emitter regions 306 are doped with a P-type impurity, such as boron. As is depicted in FIG. 3A, the alternating first and second semiconductor regions 304 and 306 may have trenches 308 formed there between, the trenches 308 extending partially into the substrate 310. Additionally, in one embodiment, an anti-reflective coating (BARC) material or other protective layer (such as a layer amorphous silicon) 309 is formed on the alternating first and second semiconductor regions 304 and 306. In an embodiment, protective layer 309 includes a silicon nitride or titanium nitride.

In an embodiment, a light receiving surface 305 can be formed on the front surface 301 of the substrate 310. In an embodiment, the light receiving surface 305 is a texturized light-receiving surface, as is depicted in FIG. 3A. Ii one embodiment, a hydroxide-based wet etchant is employed to texturize the light receiving surface 305 of the substrate 310 and, possibly, the trench 308 surfaces as is also depicted in FIG. 3A. It is to be appreciated that the timing of the texturizing of the light receiving surface 305 may vary. For example, the texturizing may be performed before or after the formation of the thin dielectric layer 302. In an embodiment, a texturized surface may be one which has a regular or an irregular shaped surface for scattering incoming light, decreasing the amount of light reflected off of the light receiving surface 305 of the solar cell. Referring again to FIG. 3A, additional embodiments can include formation of a passivation and/or anti-reflective coating (ARC) layers (shown collectively as layer 312) on the light-receiving surface 305. It is to be appreciated that the timing of the formation of passivation and/or ARC layers may also vary.

Referring to FIG. 3B and now to corresponding optional operation 104 of flowchart 100, a plurality of metal seed material regions 314 is formed to provide a metal seed material region on each of the first and second semiconductor regions 304 and 306, respectively. The metal seed material regions 314 make direct contact to the alternating first and second semiconductor regions 304 and 306.

In an embodiment, the metal seed regions 314 are aluminum regions. In one such embodiment, the aluminum regions each have a thickness approximately in the range of 0.1 to 20 microns and include aluminum in an amount greater than, approximately 97% and silicon in a amount approximately in the range of 0-2%. In other embodiments, the metal seed regions 314 include a metal such as, but not limited to, nickel, silver, cobalt or tungsten. In an embodiment, the metal seed regions 314 are formed from a blanket metal seed layer using a blanket deposition process. In that embodiment, the blanket metal seed layer may be patterned in a subsequent etching process, such as a hydroxide-based wet etching process. In some embodiments, the metal seed regions 314 can be patterned metal seed regions. In an example, a patterned metal seed region can be formed by depositing a printing process (e.g., through screen printing) and a subsequent curing process.

Referring to FIG. 3B and now to corresponding operation 106 of flowchart 100, a metal layer can be placed over the substrate. In an embodiment, the metal layer 318 can be a metal foil. In an embodiment, the metal layer 318 is an aluminum (Al) foil having a thickness approximately in the range of 5-100 microns and, preferably, a thickness approximately in the range of 20-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In an embodiment, the metal layer 318 can be placed directly over the metal seed regions 314, as shown.

In an embodiment, openings can be formed in the protective layer (e.g., a BARC layer) 309 to accommodate direct contact of the metal layer 318 to the alternating first and second semiconductor regions 304 and 306 prior to metallization or during metallization. For example in one embodiment, openings are formed in the BARC layer 309 prior to metallization, e.g., by patterning with laser ablation of a lithography and etch process. In another embodiment, metallization to form a direct contact of the metal layer 318 to the plurality of alternating first and second semiconductor regions 304 and 306 may be performed through the BARC layer 309, e.g., by laser or other spot welding, to effectively create openings in the BARC layer 309 that surround such spot welds.

It is to be appreciated that, in accordance with an embodiment, a seedless approach may be implemented. In such an approach, metal seed material regions 314 are not formed, and the metal layer 318 is placed directly over the first and second semiconductor regions 304 and 306. For example, in one embodiment, the metal layer 318 is placed directly over alternating N-type and P-type polycrystalline silicon regions. In one embodiment, a protective layer 309 (e.g., including silicon nitride or titanium nitride, among other examples) can be formed between the metal layer 318 and the first and second semiconductor regions 304, 306, where contact openings in the protective layer 309 can allow for electrical contact between the metal layer 318 and the first and second semiconductor regions 304, 306.

Referring to FIG. 3C and corresponding operation 108 of flowchart 100, a metal layer 318 is bonded to the first and second semiconductor regions. In an embodiment, the metal layer 318 is bonded to the first and second semiconductor regions by directly coupling portions of the metal layer 318 with a corresponding portion of each of the metal seed regions 314. In one embodiment, the direct coupling of portions of the metal layer 318 with a corresponding portion of each of the metal seed regions 314 involves forming a metal weld 320 at each of such locations, as is depicted in FIG. 3C. In an embodiment, forming the metal weld 320 can include performing a metallization process (e.g., a welding process). An example metallization process is described in the flowchart 200 of FIG. 2 which lists operations in a method for metallization of a solar cell corresponding to FIGS. 4 and 5.

In an embodiment, a laser 319 can be used to bond the metal layer 318 to the semiconductor regions 304, 306. In an example, a laser welding process can be used to bond the metal foil. 318 to the metal seed regions 314 and/or the semiconductor regions 304, 306. In an example, the flowchart 200 of FIG. 2 lists operations in a method of bonding a metal layer 318 to the semiconductor regions 304, 306, as discussed in detail below. In an embodiment, a galvanometer can be used to scan the laser over the metal layer 318. In one embodiment, the galvanometer can be used to position a focus of the laser. Although two lasers 319 are shown if FIG. 3C, in an embodiment, only one laser is used. In one embodiment, multiple lasers (e.g., more than one laser) can be used. In an embodiment, the laser 319 can be an infrared laser (e.g., having a wavelength of 1080 nanometers), a green laser (e.g., having a wavelength in the range of 532-1080 nanometers). In an embodiment, for a pulsed laser, the fluence can be in the range of 100-500 J/cm$^2$ and pulse lengths in the range of 0.1-1 millisecond.

In an embodiment, a grooving process 317 can be performed on the metal layer 318 to separate metal contact regions of different polarity. In an example, a laser grooving process can be performed on the metal layer 318 to form a positive and negative metal contact regions, where the positive and negative metal contact regions are coupled to the first and second semiconductor regions 304, 306, respectively. In some embodiments, a mask and etch process can be used to groove and/or form the positive and negative metal contact regions.

In an exemplary process flow, FIG. 2 is a flowchart 200 listing operations in a method for metallization of a solar cell corresponding to FIG. 4, according to some embodiments. In various embodiments, the method of FIG. 2 can include additional (or fewer) blocks than illustrated. For example, subsequent to applying a laser over a third region, the laser can be applied over a fourth region, where the laser is applied over the fourth region at a fourth scanning speed.

Referring to FIG. 4 and corresponding operation 202 from the flowchart 200 of FIG. 2, a laser can be applied over a first region 411 of a metal layer 418 to form a first metal weld 421. In an embodiment, the metal layer can be a metal foil and the substrate can be a monocrystalline silicon substrate, such as a bulk single crystalline N-type doped silicon substrate, as discussed in detail above. In an embodiment, applying the laser over the first region 411 to form the first metal weld 421 can also form a surrounding damaged region 409 around the first metal weld 421, as shown. In an example, the surrounding damaged region 409 can be a partially melted region of the metal layer 418. In one example, the surrounding damaged region 409 is a partially melted region of a metal foil. In an embodiment, the first metal weld 421 bonds the metal layer 418 to at least one semiconductor region in or above a substrate 410 (e.g., an N-type or a P-type polycrystalline region). In an embodiment, the first metal weld electrically connects the metal layer 418 to at least one semiconductor region in or above the substrate 410. In an embodiment, the first metal weld 421 can have a non-circular shape, as shown. In an example, the first metal weld 421 can have an oblong shape. In some embodiments, the first metal weld 421 can have a circular shape. In one embodiment, the first metal weld 421 can bond the metal layer 418 to a metal seed region. In an embodiment, the metal seed region can be disposed between the metal layer 418 and a semiconductor region. In an embodiment, the laser can be applied over the first region 411 at a first scanning speed. In an embodiment, the first scanning speed is at most 0.50 m/s. In some embodiments, the scanning speed can be at most 0.75 m/s. In an embodiment, the laser can be a continuous wave laser, a pulsed laser or a modulated laser.

In an example, for a pulsed laser, the first scanning speed can be configured to apply a first pulse from the pulsed laser at the first region 411. In an example, the first scanning speed can be substantially slowed (e.g., approximately 0.5 m/s) to allow for a pulse from the pulsed laser to fire at the first region 411.

In one example, for a modulated laser, the first scanning speed can be configured to apply an output signal from an on-state of the modulated laser at the first region. In an embodiment, an output signal can be an output of the modulated laser (e.g., laser output signal). In an embodiment, a modulated laser can be a continuous wave (CW) laser, where the output of the CW laser is controlled by switching between on and off state (e.g., turning the CW laser on and off). In an example, the first scanning speed can be substantially slowed (e.g., approximately 0.5 m/s) to apply an output signal from an on-state of the modulated laser at the first region 411.

Referring again to FIG. 4 and corresponding operation 204 from the flowchart 200 of FIG. 2, subsequent to applying the laser over the first region 411 at block 202, the laser is applied over a second region 413 of the metal layer 518. In an embodiment, applying the laser over the second region 413 forms a first damaged region 423 on the metal layer 418. In an embodiment, the first damaged region 423 is formed between the first metal weld 421 and a second metal weld 425. In an example, the first damaged region 423 is a partially melted region of the metal layer 418. In one example, the first damaged region 423 is a partially melted region of a metal foil. In an embodiment, the laser can be applied over the second region 413 at a second scanning speed. In an embodiment, the second scanning speed is faster than the first scanning speed. In one embodiment, the second scanning speed is at least ten times faster than the first scanning speed. In an embodiment, the second scanning speed is at least 5.00 m/s. In some embodiments, the second scanning speed can be at least 4.50 m/s.

Referring once again to FIG. 4 and corresponding operation 206 from the flowchart 200 of FIG. 2, subsequent to applying the laser over the second region 413 at block 204, the laser is applied over a third region 415 of the metal layer 418 to form a second metal weld 425. In an embodiment, the second metal weld 425 electrically connects the metal layer 418 to at least one semiconductor region in or above the substrate 410. In an embodiment, the second metal weld 425 can have a non-circular shape as shown. In an example, the second metal weld 425 can have an oblong shape. In some embodiments, the metal weld 421 can have a circular shape. In one embodiment, the second metal weld 425 can bond the metal layer 418 to a metal seed region disposed between the metal layer 418 and a semiconductor region. In an embodiment, applying the laser over the third region 415 to form the second metal weld 425 can also form a surrounding damaged region 409 around the second metal weld 425, as shown. In an example, the surrounding damaged region 419 can be a partially melted region of the metal layer 418. In one example, the surrounding damaged region 409 is a partially melted region of a metal foil. In an embodiment, the laser can be applied over the third region 415 at a third scanning speed. In an embodiment, the third scanning speed is at most 0.50 m/s. In some embodiments, the scanning speed can be at most 0.75 m/s. In an embodiment, the third scanning speed is substantially the same as the first scanning speed (e.g., 0.50 m/s). In an embodiment, the laser can be a continuous wave laser, a pulsed laser or a modulated laser.

In an example, for a pulsed laser, the third scanning speed can be configured to apply a second pulse from the pulsed laser at the third region 415. In an example, the third scanning speed can be substantially slowed (e.g., approximately 0.5 m/s) to allow for a pulse from the pulsed laser to fire at the third region 415.

In one example, for a modulated laser, the third scanning speed can be configured to apply an output signal from an on-state of the modulated laser at the third region 415. In an embodiment, a modulated laser can be a continuous wave (CW) laser, where the output of the CW laser is controlled by switching between on and off state (e.g., turning the CW laser on and off). In an example, the third scanning speed can be substantially slowed (e.g., approximately 0.5 m/s) to apply an output signal from an on-state of the modulated laser at the third region 415.

Referring again to FIG. 4, subsequent to applying the laser over the third region 415 at block 208, the laser can be applied over a fourth region 417 of the metal layer 418. In an embodiment, applying the laser over the fourth region 417 forms a second damaged region 427 on the metal layer 418. In an embodiment, the second damaged region 427 is formed between the first metal weld 425 and a second metal weld 427. In an example, the second damaged region 427 is a partially melted region of the metal layer 418. In an embodiment, the laser can be applied over the fourth region 417 at a fourth scanning speed. In an embodiment, the fourth scanning speed is at least 5.0 m/s. In some embodiments, the fourth scanning speed can be at least 4.50 m/s. In an embodiment, the fourth scanning speed is faster than the first or third scanning speed. In one embodiment, the fourth scanning speed is at least ten times faster than the first or third scanning speed. In an embodiment, the fourth scanning speed is substantially the same as the second scanning speed.

Referring once again to FIG. 4, subsequent to applying the laser over the fourth region 417, the laser can be applied over a fifth region 419 of the metal layer 418 to form a third metal weld 429. In an embodiment, the third metal weld 429 electrically connects the metal layer 418 to at least one semiconductor region in or above the substrate 410. In an embodiment, the third metal weld 429 can have a non-circular shape, as shown. In an example, the third metal weld 429 can have an oblong shape. In some embodiments, the third metal weld can have a circular shape. In one embodiment, the third metal weld 429 can bond the metal layer 418 to a metal seed region disposed between the metal layer 418 and a semiconductor region. In an embodiment, applying the laser over the fifth region 419 to form the third metal weld 429 can also form a surrounding damaged region 409 around the third metal weld 429, as shown. In an example, the surrounding damaged region 409 is a partially melted region of the metal layer 418. In one example, the surrounding damaged region 409 is a partially melted region of a metal foil. In an embodiment, the laser can be applied over the fifth region 419 for a third scanning speed. In an embodiment, the third scanning speed is at most 0.50 m/s. In some embodiments, the scanning speed can be at most 0.75 m/s. In an embodiment, the third scanning speed is substantially the same as the first scanning speed (e.g., 0.50 m/s). In an embodiment, multiple scanning speeds, e.g. first, second, third, fourth, fifth, etc., can be used to form multiple metal welds.

In an example, for a pulsed laser, the fifth scanning speed can be configured to apply a third pulse from the pulsed laser at the fifth region 419. In an example, the fifth scanning speed can be substantially slowed (e.g., approximately 0.5 m/s) to allow for a pulse from the pulsed laser to fire at the fifth region 419.

In one example, for a modulated laser, the third scanning speed can be configured to apply an output signal from an on-state of the modulated laser at the fifth region 419. In an example, the fifth scanning speed can be substantially slowed (e.g., approximately 0.5 m/s) to apply an output signal from an on-state of the modulated laser at the fifth region 419.

Referring to FIG. 5 and corresponding to the portion of the solar cell of FIG. 4, a graph 500 showing exemplary scanning speeds for metallization of the solar cell of FIG. 5 is shown, according to some embodiments.

In an embodiment, a constant scanning speed 501 can be used to scan a laser over a metal layer 418 to form metal welds 421, 425, 429 between a metal layer 418 and a semiconductor region of a solar cell 400. In an example, a constant scanning speed of 0.5 m/s can be used. At a constant scanning speed of 0.5 m/s over a 36 meter scanning distance (e.g., over the surface of a silicon substrate of a solar cell), the total scan time can be 72 seconds. As a manufacturing requirement, faster scan times can be required to increase the total throughput of a solar cell manufacturing process. Thus, faster scan times, e.g., faster than 72 seconds, can be required. It has been observed that merely increasing the constant scanning speed. 501 results in poor electrical contact between the metal layer and semiconductor region. In an example, using a pulsed laser with a repetition rate of 500 hertz at scanning speeds of 1.0 m/s can result in poor electrical contact (e.g., poor welding) between the metal layer and semiconductor region.

In an embodiment, in contrast to the above technique, the scanning speed of a laser can instead be varied. (e.g., not constant) over the entire scan of substrate. Referring to both FIGS. 4 and 5, in an embodiment, a laser is applied over a first region 411 of a metal layer 418 to form a first metal weld 421, where the laser is applied at a first scanning speed 522. In an embodiment, subsequent to applying the laser over a first region 411 of the metal layer 418, the laser is applied over a second region 413 of the metal layer 418, where the laser is applied at a second scanning speed 524. In an embodiment, the second scanning speed 524 is faster than the first scanning speed 522. In one embodiment, the second scanning speed 524 is at least ten times faster than the first scanning speed 522. In an embodiment, subsequent to applying the laser over a second region 413 of metal layer 418, the laser is applied over a third region 415 of the metal layer 418 to form a second metal weld 425, where the laser is applied at a third scanning speed 526. In an embodiment, the average scanning speed 507 of the first, second and third scanning speeds 522, 524, 526 can be at least twice as fast in comparison to using a constant scanning speed 501. In an example, for a 36 meter scanning distance the average scanning speed 507 can be 1.6 m/s or 2.7 m/s. In contrast, to get good electrical contact between the metal layer and the semiconductor region at a metal weld, a constant scanning speed 501 of 0.5 m/s can be required for a 36 meter scanning distance. In an embodiment, the first scanning speed can be at most 0.5 m/s. In an embodiment the second scanning speed 524 can be at least 5.0 m/s. In some embodiments, the second scanning speed 524 can be at least 4.50 ms. In one embodiment, the scanning speed (e.g., first, second, third, or more scanning speeds) can be configured to allow good electrical, contact (e.g., metal welds) between the metal layer and a semiconductor region at an increased average scanning speed (e.g., in comparison to a constant scanning speed). In an example, the first and third scanning speed 522 can be 0.5 m/s, the second scanning speed 524 speed can be 5.0 m/s for a 36 meter scan path resulting in an approximately 24 second overall scan time. In one example, the second scanning speed 524 can be substantially faster than the first and third scanning 522, 526 speed to allow faster average scanning speed, in comparison to the constant scan speed, while forming good electrical contact between the metal layer and semiconductor region. In an embodiment, the first and third scanning speed 522, 526 can be used to from the metal welds 421, 425 and the second scanning speed 524 can be used to scan the laser from the first metal weld 421 to the second metal weld 425. It is to be appreciated that although a first, second and third scanning speeds are disclosed, multiple scanning speed, e.g., a fourth, fifth, sixth, etc., can be used. In an embodiment, the third scanning speed 526 can be substantially the same as the first scanning speed 522. In an embodiment, a fourth scanning speed can be substantially the same as the second scanning speed 524. In an embodiment, the speed of the weld at the first and third scanning speed can be 0.6 m/s. In some embodiments, a total process time of approximately 29.5 seconds can be attained for a 36 meter scanning distance. Thus varying the scanning speed at 503 to be slower during welding (e.g., 0.5 m/s), e.g., at 522, 526, and to scan faster between welding (e.g., 5.0 m/s), at 524, can result in a faster overall average scanning speed 507 in comparison to using a constant scanning speed 501, without loss to the electrical conduction of the formed metal weld.

In an embodiment, the laser can be a continuous wave laser, a pulsed laser or a modulated laser. In one embodiment, a galvanometer can be used to scan the laser over a substrate (e.g., a silicon substrate and/or a solar cell).

In an embodiment, for a pulsed laser, a first scanning speed 522 can be configured to apply a first pulse 514 from the pulsed laser at the first region 411. In an example, the first scanning speed 522 can be substantially slowed (e.g., approximately 0.5 m/s) to apply the first pulse 514 from the pulsed laser at the first region 411. In an embodiment, applying the first pulse 514 from the pulsed laser at the first region 411 can form a first metal weld 421. In an embodiment, subsequent to applying the first pulse 514 from the pulsed laser at the first region 411, at least one galvanometer mirror can be scanned over a second region 413 of the metal layer 418 to position a focus of the laser from the first region 411 to a third region 415, where at least one galvanometer can be scanned at a second scanning speed 524. In an embodiment, the second scanning speed 524 can be faster than the first scanning speed 522. In one embodiment, the second scanning speed 524 can be at least ten times faster than the first scanning speed 522. In an embodiment, the scanning can include scanning at least two galvanometer mirrors over a second region. In one embodiment, scanning at least one galvanometer mirror can include scanning at least one galvanometer mirror for a duration between a first pulse and a second pulse of the pulsed laser. In an embodiment, subsequent to scanning at least one galvanometer mirror over a second region 413 of metal layer 418, the pulsed laser can be applied over the third region 415 of the metal layer 418 to form a second metal weld 425, where the pulsed laser is applied at a third scanning speed 526. In an embodiment, a third scanning speed 526 can be configured to apply a second pulse 518 from the pulsed laser at the third region 415. In an embodiment, applying the second pulse 518 from the pulsed laser at the third region 415 can form a second metal weld 425. In an embodiment, a plurality of scanning speeds can be configured to apply a plurality of pulses to form a plurality of metal welds. In an embodiment, the pulsed laser can have a 500 hertz pulse repetition rate. Although the scanning speeds 522, 526 are shown to be in alignment with the laser pulses 514, 518 in some embodiments, the scanning speed need not necessarily match the scanning speed profiles shown. In an example, a pulse can be started before the scanning speed 522 slows down and stopped before the scanning speed speeds up.

In one example, for a modulated laser, a first scanning speed 522 can be configured to apply a first output signal 514 from an on-state of the modulated laser at the first region 411. In an embodiment, a modulated laser can be a continuous wave (CW) laser, where the output of the CW laser is controlled by switching between on and off state (e.g., turning the CW laser on and off). In an example, the first scanning speed 522 can be substantially slowed (e.g., approximately 0.5 m/s) to apply a first output signal 514 from an on-state of the modulated laser at the first region 411. In an embodiment, applying the first output signal 514 from the modulated laser at the first region 411 can form a first metal weld 421. In an embodiment, subsequent to applying the first output signal 514 from the modulated laser at the first region 411, at least one galvanometer mirror can be scanned over a second region 413 of the metal layer 418 to position a focus of the laser from the first region 411 to a third region 415, where at least one galvanometer mirror can be scanned at a second scanning speed 524. In an example, the second scanning speed 524 can be substantially increased (e.g., approximately 5.00 m/s). In an embodiment, the second scanning speed 524 can be faster than the first scanning speed 522. In one embodiment, the second scanning speed. 524 can be at least ten times faster than the first scanning speed 522. In an embodiment, the scanning can include scanning at least two galvanometer mirrors over a second region. In one embodiment, scanning at least one galvanometer mirror can include scanning at least one galvanometer mirror for a duration between a first pulse and a second pulse of the pulsed laser. In an embodiment, subsequent to scanning at least one galvanometer mirror over the second region 413 of metal layer 418, a third scanning speed 526 can be configured to apply a third output signal 518 from an on-state of the modulated laser at a third region 415 of the metal layer 418 to form a second metal weld 425. In an example, the third scanning speed. 526 can be substantially slowed (e.g., approximately 0.5 m/s) to apply a third output signal 518 from an on-state of the modulated laser at the third region 415. In an embodiment, applying the third output signal 518 from the modulated laser at the third region 415 can form a second metal weld 425. In an embodiment, a plurality of scanning speeds can be configured to apply a plurality of output signals from the modulated laser to form a plurality of metal welds.

In an embodiment, using the varying scanning speed technique 503 discussed above can be 3-5 times faster in comparison to using a constant scanning speed 501.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
   a semiconductor region disposed in or above a substrate;
   a metal layer over the semiconductor region;
   a first non-circular shaped metal weld;
   a second non-circular shaped metal weld; and
   a first damaged region on the metal layer, wherein the first damaged region is located between the first and second non-circular shaped metal welds.

2. The solar cell of claim 1, wherein the semiconductor region comprises an N-type polycrystalline region or a P-type polycrystalline region.

3. The solar cell of claim 1, wherein the metal layer comprises a metal foil.

4. The solar cell of claim 1, wherein the metal layer comprises aluminum.

5. The solar cell of claim 1, further comprising a metal seed region disposed between the metal layer and the semiconductor region.

6. The solar cell of claim 5, wherein the first and second non-circular shaped metal welds electrically connect the metal layer to the metal seed region.

7. The solar cell of claim 1, wherein the first and second non-circular shaped metal welds comprise a first and second oblong shaped metal welds.

8. The solar cell of claim 1, further comprising:
   a third non-circular shaped metal weld; and
   a second damaged region on the metal layer, wherein the second damaged region is located between the second and third non-circular shaped metal welds.

* * * * *